United States Patent [19]
Wakabayashi

[11] Patent Number: 5,283,476
[45] Date of Patent: Feb. 1, 1994

[54] WAVEFORM GENERATOR

[75] Inventor: Toshitsugu Wakabayashi, Nagasaki, Japan

[73] Assignee: Mitsubishi Denki Kabushiki Kaisha, Tokyo, Japan

[21] Appl. No.: 907,561

[22] Filed: Jul. 2, 1992

[30] Foreign Application Priority Data

Aug. 28, 1991 [JP] Japan .................. 3-240342

[51] Int. Cl.⁵ .............................. H03K 4/12
[52] U.S. Cl. .................... 307/227; 307/228; 328/185
[58] Field of Search ............ 307/227, 228; 328/185

[56] References Cited

U.S. PATENT DOCUMENTS

| | | | |
|---|---|---|---|
| 3,839,679 | 10/1974 | Hughes | 307/228 |
| 4,225,825 | 9/1980 | Watts | 327/228 |
| 4,322,636 | 3/1982 | Shröeder | 307/228 |
| 4,654,542 | 3/1987 | Baird et al. | 307/227 |
| 5,134,308 | 7/1992 | Boemi | 328/185 |

FOREIGN PATENT DOCUMENTS 62-38693 3/1987 Japan .
63-99675 4/1988 Japan .

Primary Examiner—William L. Sikes
Assistant Examiner—Scott A. Ouellette
Attorney, Agent, or Firm—Burns, Doane, Swecker & Mathis

[57] ABSTRACT

This invention relates to a waveform generator used in a CRT display unit or the like, and to an apparatus for generating intended saw-tooth waveforms and parabolic waveforms under control of a microcomputer. The microcomputer produces a charging control signal having a prescribed pulse frequency and duty-cycle for forming a rising period in one cycle of the output waveform and supplies the signal to terminal a. Then, a capacitor is charged through a transistor and charging resistor. The microcomputer produces a discharging control signal having a prescribed pulse frequency and duty-cycle for forming a falling period in a cycle of the output waveform and supplies the signal to terminal b. Then, the capacitor is discharged through a transistor and discharging resistor. The output waveform voltage is produced across the capacitor.

6 Claims, 4 Drawing Sheets

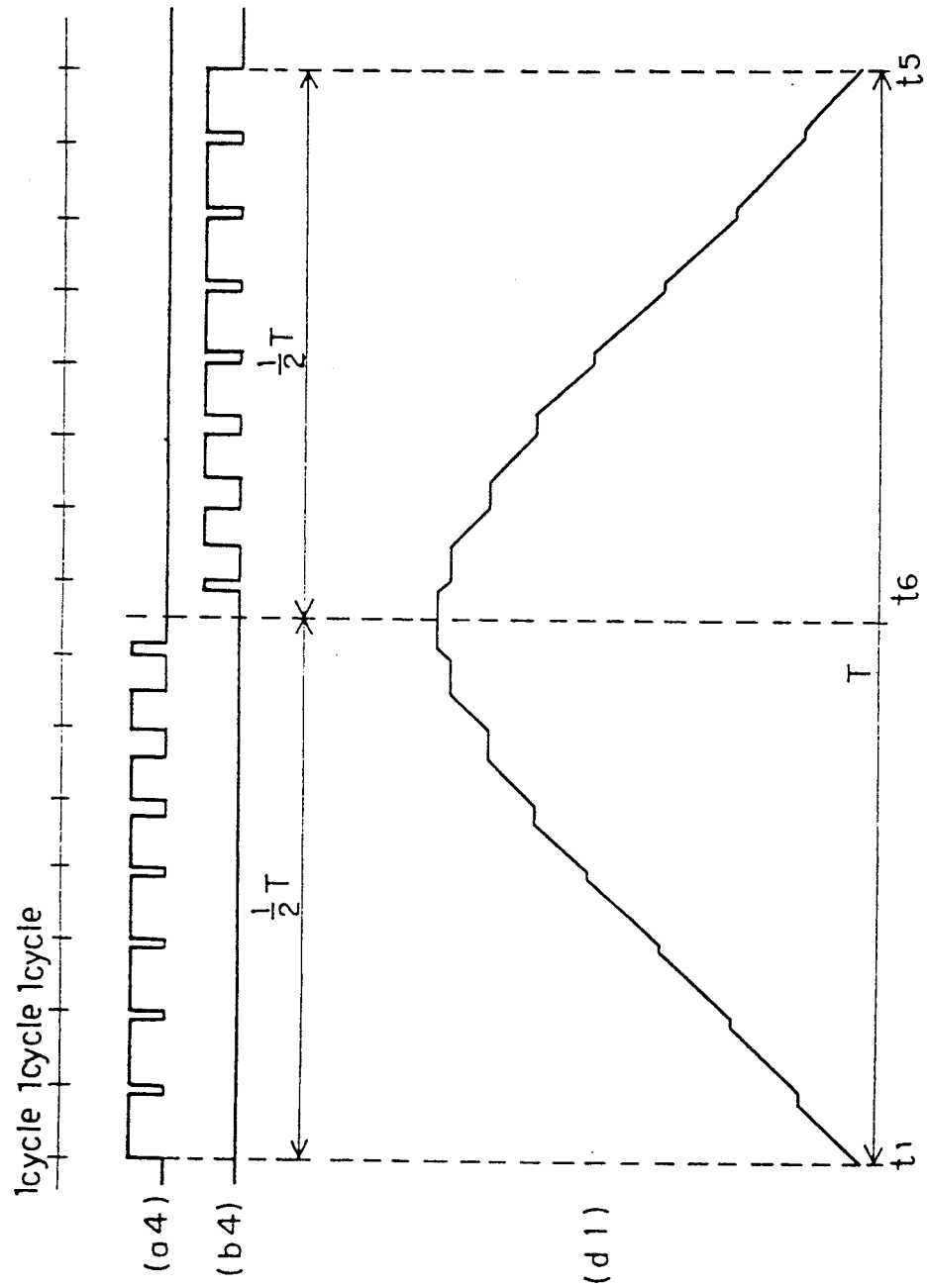

WAVEFORM GENERATOR

BACKGROUND OF THE INVENTION

1. Field of the Invention

The present invention relates to a waveform generator which is used in CRT display unit or the like and adapted to generate saw-tooth waves and parabolic waves.

2. Description of the Prior Art

FIG. 1 is a schematic diagram showing a conventional waveform generator. In the figure, indicated by 13 is a comparator, 2 is a resistor connected to a D.C. power source 1, 3 is a capacitor connected to the resistor 2, 4 is a transistor having its emitter grounded, its collector connected to the node between the resistor 2 and capacitor 3, and its base connected to the output of the comparator 13. The comparator 13 has its one input terminal connected to the node between the resistor and capacitor mentioned above and another input terminal connected to a reference voltage source 14. Indicated by 15 is an integrator formed of a double-balanced differential amplifier or the like, with its input terminal connected to the above-mentioned node which is the output terminal c of saw-tooth waves. The integrator 15 has an output terminal indicated by d.

FIG. 2 is a timing chart showing saw-tooth waves produced on the output terminal c shown in FIG. 1 and a parabolic wave produced on the output terminal d of the integrator 15. Shown by c5 is a saw-tooth waveform having a period of T, c6 is a saw-tooth waveform having a period of ⅔T, and d2 is a parabolic waveform.

Next, the operation will be explained. With the transistor 4 being in a cutoff state, the capacitor 3 is charged by the D.C. power source 1 through the resistor 2. Consequently, the voltage of the output terminal c rises progressively along the charging curve which is the saw-tooth wave c5 shown in FIG. 2. When the voltage becomes equal to the reference voltage 14 which is applied to one input terminal of the comparator 13, it produces an output signal on its output terminal. Receiving the comparator output on the base, the transistor 4 becomes conductive, and it discharges the capacitor 3 through the collector and emitter, causing the voltage of the output terminal c to fall to zero. In order to get the saw-tooth wave output c6 having a period shorter than that of the saw-tooth wave c5, the magnitude of the current flowing through the resistor 2 is varied.

In this manner, the oscillation frequency of saw-tooth wave can be set arbitrarily by varying the current of the resistor 2, with the values of the resistor 2 and capacitor 3 being set constant. Through the integration of the saw-tooth wave output c5 or c6 with the integrator 15, a symmetrical parabolic waveform as shown by d in FIG. 2 is produced.

However, the conventional waveform generator arranged as described above needs to vary the current of the resistor 2 for changing the oscillation frequency, which cannot be done easily. Moreover, CRT display units have the additional provision of an S-shaped modification circuit for the correction of linearity in the vertical direction and a PCC circuit for the correction of pincushion distortion, and these circuits used with the conventional waveform generator are expensive and are not responsive to a changing frequency.

SUMMARY OF THE INVENTION

An object of the present invention is to provide a waveform generator which easily generates saw-tooth waves and the like through the control of charging and discharging of the capacitor based on the individual charging and discharging control signals.

The waveform generator based on this invention comprises a capacitor on which the voltage of generated waveform is held, a charging circuit for controlling the charging of the capacitor, a discharging circuit for controlling the discharging of the capacitor, and a microcomputer which controls the charging and discharging circuits in an on-off fashion by using a charging control signal and a discharging control signal each having a variable pulse width and a variable number of pulses per preset time period.

The microcomputer operates to control the charging and discharging circuits in an on-off fashion by using the charging and discharging control signals each having a variable pulse width and a variable number of pulses per preset time period, thereby producing a saw-tooth waveform voltage across the capacitor. The microcomputer operates to adjust the duty-cycle of the charging and discharging control signals thereby to vary the linearity of the output saw-tooth waveform. The microcomputer operates to increase progressively the duty-cycle of one of the charging and discharging control signals and decrease the duty-cycle of the other, thereby producing a parabolic waveform or triangular waveform.

BRIEF DESCRIPTION OF THE DRAWINGS

FIG. 5 is a timing chart showing the signal waveforms at various portions of the waveform generator based on another embodiment of this invention.

DETAILED DESCRIPTION OF THE PREFERRED EMBODIMENTS

Figure 1:
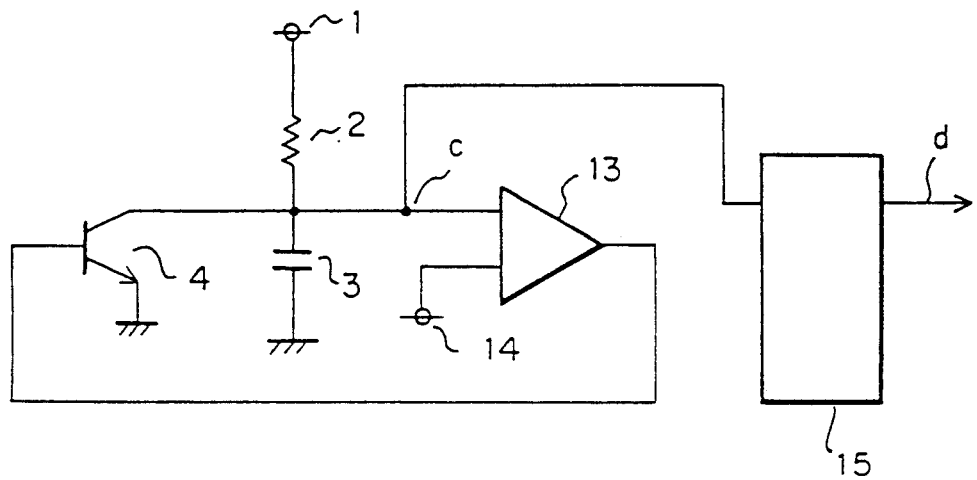
FIG. 1 is a schematic diagram showing the conventional waveform generator.
Figure 2:
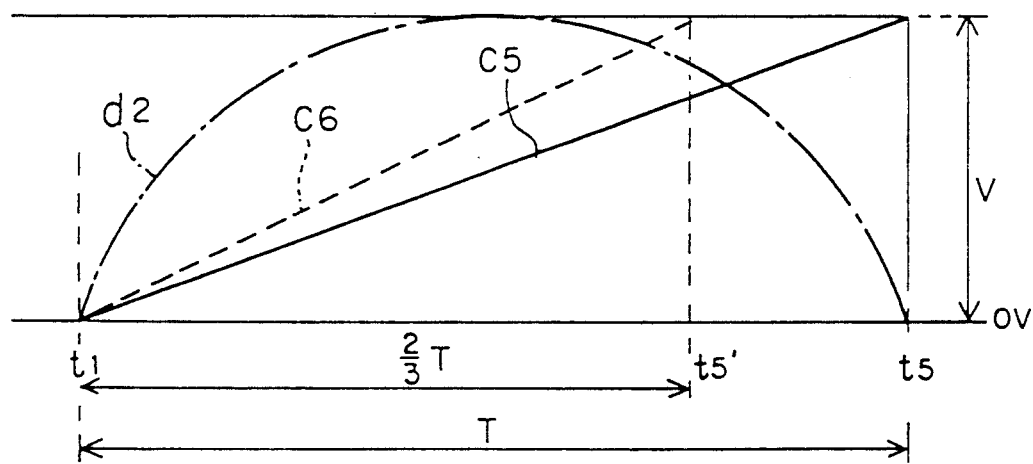
FIG. 2 is a diagram used to explain the signal waveforms at various portions of the circuit shown in FIG. 1.
Figure 3:
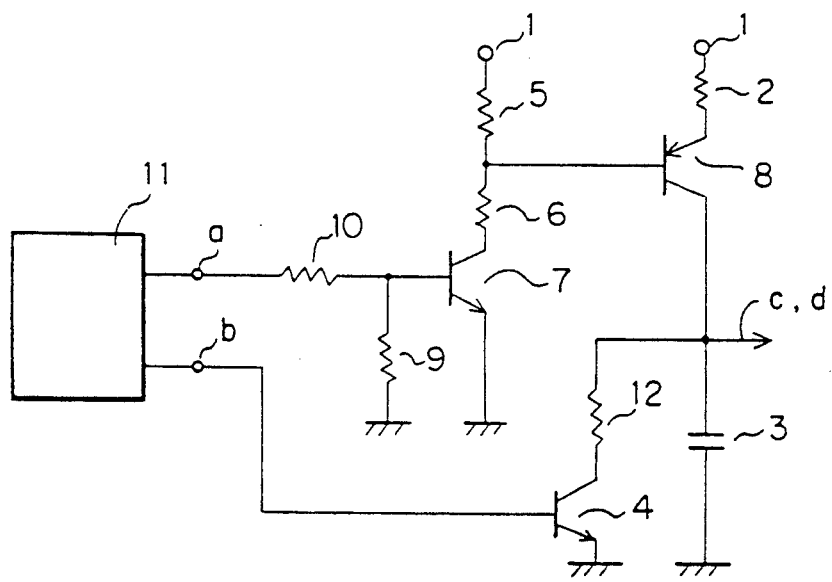
FIG. 3 is a block diagram showing the waveform generator based on an embodiment of the present invention.

An embodiment of this invention will be described with reference to the drawings. In FIG. 3, indicated by a is the input terminal for introducing from a microcomputer 11 a control signal for controlling the charging current of saw-tooth waveform, b is the input terminal for introducing from the microcomputer 11 a control signal for controlling the discharging current, 9 and 10 are resistors for dividing the voltage of the signal on the input terminal a, and 7 is an NPN transistor which receives the divided signal voltage on its base and has its emitter grounded and its collector connected to the D.C. power source 1 through resistors 5 and 6.

Indicated by 8 is a PNP transistor having its base connected to the node of the resistors 5 and 6, its emitter connected to the D.C. power source 1 through a resistor 2 and its collector grounded through a capacitor 3. Connected to the input terminal b is the base of an NPN transistor having its collector connected to one terminal of the capacitor 3 through a resistor 12 and its emitter grounded.

Figure 4:
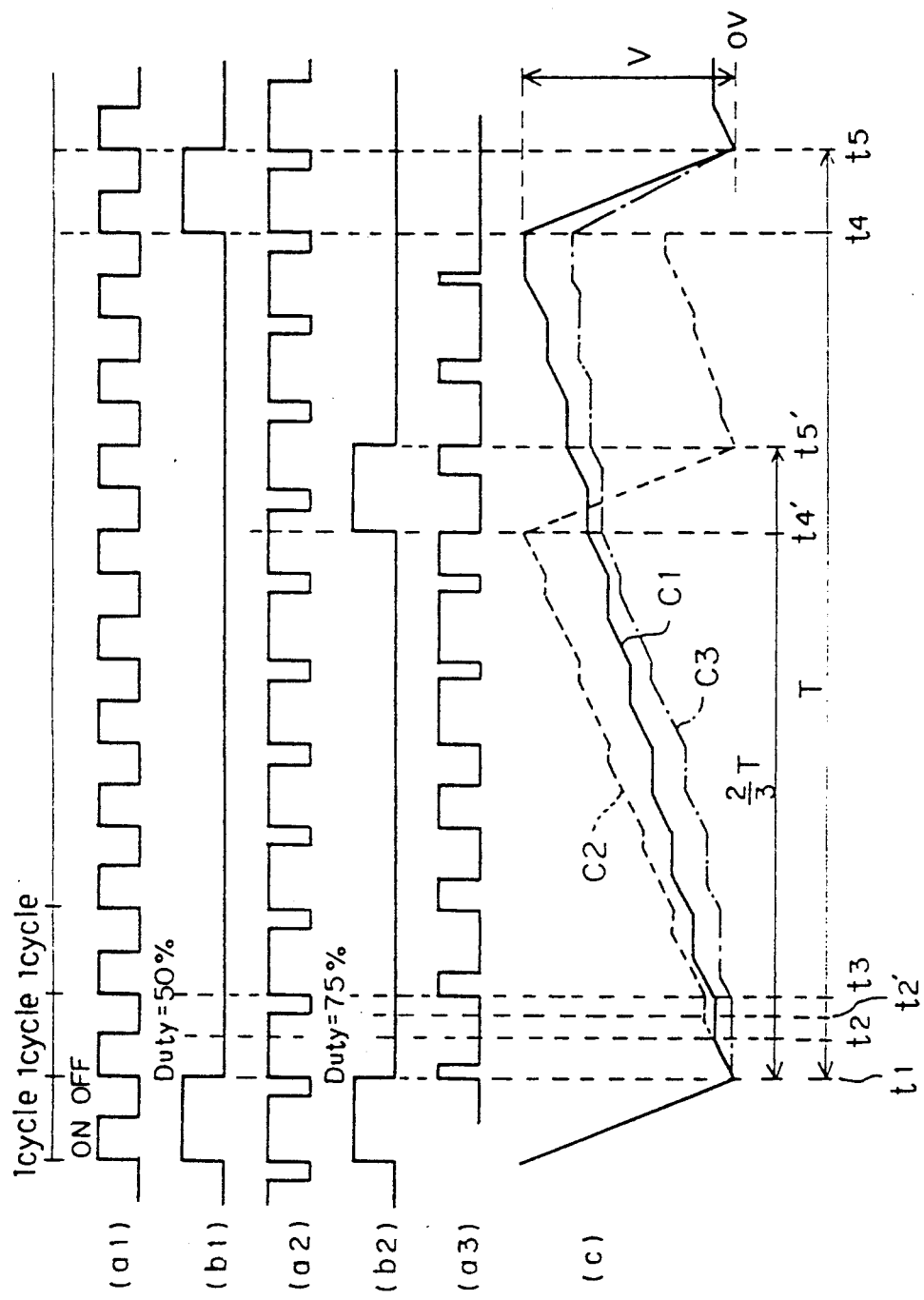
FIG. 4 is a timing chart showing the signal waveforms at various portions of the circuit shown in FIG. 3.

FIG. 4 is a timing chart showing the timing relation among charging current control signals a1, a2 and a3 received on the input terminal a, discharging current control signals b1 and b2 received on the input terminal b, and voltages across the capacitor 3, i.e., output voltages c1, c2 and c3 of produced saw-tooth waveforms. The output voltage c1 is produced when the control signals a1 and b1 are received on the input terminals a and b, respectively, the output voltage c2 is produced when the control signals a2 and b2 are received on the input terminals a and b, respectively, and output voltage c3 is produced when the control signals a3 and b1 are received on the input terminals a and b, respectively. Shown by (c) in FIG. 4 is the affair of linearity control for the saw-tooth waveforms resulting from the control signals a1, a2 and a3.

FIG. 5 is a timing chart showing the timing relation among another set of charging control signal a4 and discharging control signal b4 received on the input terminals a and b, respectively, and output voltage d1 of a parabolic waveform produced across the capacitor 3. The control signals a4 and b4 are symmetric with respect to the time point $\frac{1}{2}T$.

Next, the operation will be explained. When the control signal a1 having a 50% duty-cycle as shown in FIG. 4 is applied to the input terminal a, the transistors 7 and 8 become conductive and the transistor 4 is cut off during the period between $t_1$ and $t_2$ in which the signal a1 is "1" and the control signal b1 is absent on the input terminal b. Consequently, a charging current flows from the D.C. power source 1 to the capacitor 3 through the resistor 2, and the capacitor 3 is charged.

At time point $t_2$, the control signal a1 on the input terminal a goes "0", causing the transistors 7 and 8 to be cut off, and the voltage across the capacitor 3 at time point $t_2$ is kept unchanged until time point $t_3$ as shown by the output signal c1 in FIG. 4. These operations are repeated until time point $t_4$ when the input signal b1 goes "1" is reached, and the voltage across the capacitor 3 reaches V.

At $t_4$, the control signal b1 goes "1", causing the transistor 4 to become conductive, and the capacitor 3 is discharged through the resistor 12 until $t_5$. Consequently, the output voltage c1 forms a saw-tooth wave having an amplitude of V and a period of $T(t_5-t_1)$.

Next, the operation of producing the saw-tooth waveform voltage c2 having an amplitude of V and a period of $\frac{3}{4}T$ as shown in FIG. 4 will be explained. The voltage across the capacitor 3 is expressed as $V=(1/Q)I\cdot T_{on}$, where Q is the capacity of the capacitor 3, V is the magnitude of the output voltage, I is the current flowing through the resistor 2, and $T_{on}$ is the total "1" state duration of the control signal applied to the input terminal a.

Since the capacity Q and current I are constant, by changing the total duration $T_{on}$, i.e., the duty-cycle of the control signal a1 or a2 in FIG. 4, the amplitude of the saw-tooth waveform can be controlled. By setting the total duration $T_{on}$ over a period of $\frac{3}{4}T$ equal to the $T_{on}$ over the period T in case the waveform c1 is obtained, i.e., by application of the control signal a2 with a 75% duty-cycle to the input terminal a, the saw-tooth waveform voltage c2 having an amplitude of V and a period of $\frac{3}{4}T$ is produced.

Namely, the slope of saw-tooth waveform is varied by providing a different duty-cycle of control signal as shown by a1, a2 and a3, and this property is used to control the linearity of saw-tooth waveform as shown by (c) in FIG. 4. For example, the control signal a3 has its duty-cycle reduced around the time point $t_1$, has the largest duty-cycle around the time point of $\frac{1}{2}T$, and has its duty-cycle reduced again around the time point $t_4$, resulting in an output saw-tooth waveform voltage with the rendition of S-shaped slope modification as shown by c3 in FIG. 4.

Next, the operation of producing a parabolic waveform voltage d1 which is symmetric with respect to a certain time point will be explained with reference to FIG. 5. Initially, a control signal a4 which varies in duty-cycle over the output cycle is applied to the input terminal a. Consequently, the voltage across the capacitor 3 follows the charging curve over the period between $t_1$ and $t_6$, in which the control signal b4 is kept "0". At time point $t_6$, a control signal b4 which is symmetric with the control signal a4 is applied to the input terminal b. Consequently, the capacitor 3 is discharged through the transistor 4 and resistor 12, and the parabolic waveform voltage d1 follows the discharging curve over the period between $t_6$ and $t_5$, in which the control signal on the input terminal a is kept "0".

According to this invention, as described above, the waveform generator comprises a capacitor on which the voltage of generated waveform is held, a charging circuit for controlling the charging of the capacitor, a discharging circuit for controlling the discharging of the capacitor, and a microcomputer which controls the charging and discharging circuits in an on-off fashion by using a charging control signal and a discharging control signal each having a variable pulse width and a variable number of pulses per preset time period, whereby saw-tooth waveforms responsive to input frequencies can be produced without the aid of external operation.

The microcomputer is designed to control the charging and discharging circuits in an on-off fashion by using the charging and discharging control signals each having a variable pulse width and a variable number of pulses per preset time period, and, in addition, adjust the duty-cycle of the control signals, whereby the amplitude and linearity of the output saw-tooth waveform can be regulated arbitrarily.

The microcomputer is designed to control the charging and discharging circuits in an on-off fashion by using the charging and discharging control signals each having a variable pulse width and a variable number of pulses per preset time period, and, in addition, increase and decrease progressively the duty-cycle of one and the other of the charging and discharging control signals during the preset time period, whereby parabolic waveforms and triangular waveforms can easily be produced without the aid of external circuitry.

What is claimed is:

1. A waveform generator comprising a capacitor on which a generated voltage waveform is held, a charging circuit for charging said capacitor in response to a charging control signal, a discharging circuit for discharging said capacitor is response to a discharging control signal, and a microcomputer which controls said charging and discharging circuits independently in an on-off fashion by generating the charging control signal and the discharging control signal each having at least one of an adjustable pulse width and an adjustable number of pulses per preset time period for controlling shape of the generated voltage waveform.

2. A waveform generator according to claim 1, wherein said charging circuit comprises a transistor and charging resistor for supplying a charging current to said capacitor during an on-period of said charging control signal, and said discharging circuit comprises a transistor and discharging resistor for conducting a discharging current from said capacitor during an on-period of said discharging control signal.

3. A waveform generator according to claim 1, wherein said microcomputer produces a charging control signal which has such a pulse frequency that the generated voltage waveform reaches a first intended value in a rising period in a cycle of the generated voltage waveform and produces a discharging control signal which has such a pulse width that the generated voltage waveform falls to a second intended value in a falling period of the cycle of the generated voltage waveform.

4. A waveform generator according to claim 1, wherein said microcomputer produces a charging control signal which has such a duty-cycle that the generated voltage waveform reaches a first intended value in a rising period in a cycle of the generated voltage waveform and produces a discharging control signal which has such a pulse width that the generated voltage waveform falls to a second intended value in a falling period in the cycle of the generated voltage waveform.

5. A waveform generator according to claim 1, wherein said microcomputer produces a charging control signal which has such a pulse frequency and duty-cycle that the generated voltage waveform rises along a first predetermined slope and reaches a first predetermined value in a rising period in a cycle of the generated voltage waveform and produces a discharging control signal which has such a pulse frequency and duty-cycle that the generated voltage waveform falls along a second predetermined slope to a second predetermined value in a falling period of the cycle of the generated voltage waveform.

6. A waveform generator according to claim 5, wherein magnitude of gradient of the generated waveform voltage increases in response to the microcomputer expanding an on-period of the pulse width of either of the charging and discharging control signals, and wherein magnitude of gradient of the generated waveform voltage decreases in response to the microcomputer reducing the on-period of the pulse width of either of the charging and discharging control signals.

* * * * *